United States Patent [19]
Roberts et al.

[11] Patent Number: 5,376,577
[45] Date of Patent: Dec. 27, 1994

[54] METHOD OF FORMING A LOW RESISTIVE CURRENT PATH BETWEEN A BURIED CONTACT AND A DIFFUSION REGION

[75] Inventors: Martin C. Roberts; Tyler A. Lowrey, both of Boise, Id.

[73] Assignee: Micron Semiconductor, Inc., Boise, Id.

[21] Appl. No.: 268,489

[22] Filed: Jun. 30, 1994

[51] Int. Cl.$^5$ .............................................. H01L 21/70
[52] U.S. Cl. ........................................ 437/52; 437/26; 437/162; 437/156
[58] Field of Search .................. 437/26, 52, 160, 162, 437/247, 931, 934, 156, 158, 186

[56] References Cited

U.S. PATENT DOCUMENTS

| | | | |
|---|---|---|---|
| 4,502,894 | 3/1985 | Seto et al. | 437/156 |
| 5,278,082 | 1/1994 | Kawamura | 437/29 |
| 5,290,718 | 3/1994 | Fearson et al. | 437/34 |
| 5,292,684 | 3/1994 | Chung et al. | 437/69 |
| 5,316,965 | 5/1994 | Philipossian et al. | 437/70 |

Primary Examiner—Olik Chaudhuri
Assistant Examiner—S. Mulpuri
Attorney, Agent, or Firm—David J. Paul

[57] ABSTRACT

The present invention is a Static Random Access Memory fabrication process for forming a buried contact, by the steps of: patterning a photoresist layer over the field silicon dioxide regions and the spaced apart areas of the substrate, thereby providing a buried contact implant window to expose a portion of at least one spaced apart area and an adjacent field silicon dioxide end portion; implanting an N-type dopant through the buried implant contact window, the implant forming a first N-type diffusion region in the exposed spaced apart area and changing the etch rate of the exposed field silicon dioxide end portion; stripping the masking layer; growing a sacrificial silicon dioxide layer, over the field silicon dioxide regions and the spaced apart areas of the supporting silicon substrate, thereby annealing the exposed field silicon dioxide end portion and returning the etch rate of the exposed field silicon dioxide end portion to substantially the same etch rate as prior to the implantation step; stripping the sacrificial silicon dioxide layer; growing a gate silicon dioxide layer over the spaced apart areas; depositing a first polysilicon layer over the gate silicon dioxide layer; patterning a buried contact window in the first polysilicon layer, thereby exposing the first N-type diffusion region and re-exposing the field silicon dioxide end portion; depositing a second polysilicon layer superjacent the first polysilicon layer and patterning whereby the first polysilicon layer forms a gate over the gate and the second polysilicon layer makes direct contact to the first N-type diffusion region; wherein the dopants from the patterned doped polysilicon forms a second N-type diffusion region within the first N-type diffusion region.

16 Claims, 3 Drawing Sheets

METHOD OF FORMING A LOW RESISTIVE CURRENT PATH BETWEEN A BURIED CONTACT AND A DIFFUSION REGION

FIELD OF THE INVENTION

This invention relates to semiconductor fabrication process and more particularly to a process to form a buried contact.

BACKGROUND OF THE INVENTION

During Static Random Access Memory (SRAM) semiconductor fabrication a conventional process for defining an implant into the substrate between thick field oxide regions for the storage cell region is depicted in FIGS. 5-8.

As shown in FIG. 5, wafer substrate 50 has been prepared with regions of thick (or field) oxide 51 and sacrificial oxide 52. Photoresist 53 is patterned to define a buried contact implant window 54. Once the implant window is prepared an implant is performed through window 54 that forms diffusion region 55. The edge of field oxide 51 was exposed during the implant which effectively changes the etch rate of the field oxide.

As shown in FIG. 6, photoresist 53 has been stripped as has sacrificial oxide 52. During the sacrificial oxide strip, thinning occurs at the exposed edge of field oxide 51 due to the change of the oxide's etch rate and thus results in the notched field oxide area 61.

Once the field oxide has been damaged by the buried contact implant and thinning occurs the cell area is now prone to leakage as demonstrated in FIG. 7. FIG. 7 shows a patterned portion of the cell with patterned polysilicon layer 71 making contact to diffusion region 72a. As can be seen, further thinning of field oxide 51 has occurred at notches 61 and 73. This thinning of field oxide reduces its ability to prevent cell leakage between diffusion 72a and diffusion 72b (as depicted by arrow 74 showing electron flow from one diffusion region to another).

As one skilled in the art recognizes, the cell leakage is very undesirable as the leakage will reduce the cell's storage capability and may even render the cell as totally defective.

The present invention provides an effective method that will avoid cell leakage while forming a low resistive path between a buried contact and a diffusion region.

SUMMARY OF THE INVENTION

The present invention is a semiconductor fabrication process for forming a buried contact on a supporting substrate having areas spaced apart by field silicon dioxide regions, by the steps of:

forming a patterned masking layer over the field silicon dioxide regions and the spaced apart areas of the supporting substrate, thereby providing a buried contact implant window to expose a portion of at least one spaced apart area and an adjacent field silicon dioxide end portion;

performing a dopant implant through the buried contact implant window, the implant forming a first diffusion region in the exposed spaced apart area and changing the etch rate of the exposed field silicon dioxide end portion;

removing the patterned masking layer;

forming a sacrificial silicon dioxide layer at a temperature greater than 700° C., over the field silicon dioxide regions and the spaced apart areas of the supporting silicon substrate, thereby annealing the exposed field silicon dioxide end portion and returning the etch rate of the exposed field silicon dioxide end portion to substantially the same etch rate as prior to the implantation step;

removing the sacrificial silicon dioxide layer;

forming a gate silicon dioxide layer over the spaced apart areas;

providing a buried contact window which exposes the first diffusion region and re-exposes the field silicon dioxide end portion; and forming a patterned layer of doped polysilicon that makes direct contact to the first diffusion region via the buried contact window;

wherein an out-diffusion of the dopants from the patterned doped polysilicon forms a second diffusion within the first diffusion region.

DETAILED DESCRIPTION OF THE INVENTION

The present invention is depicted by the process steps represented in FIGS. 1-4.

Figure 1:
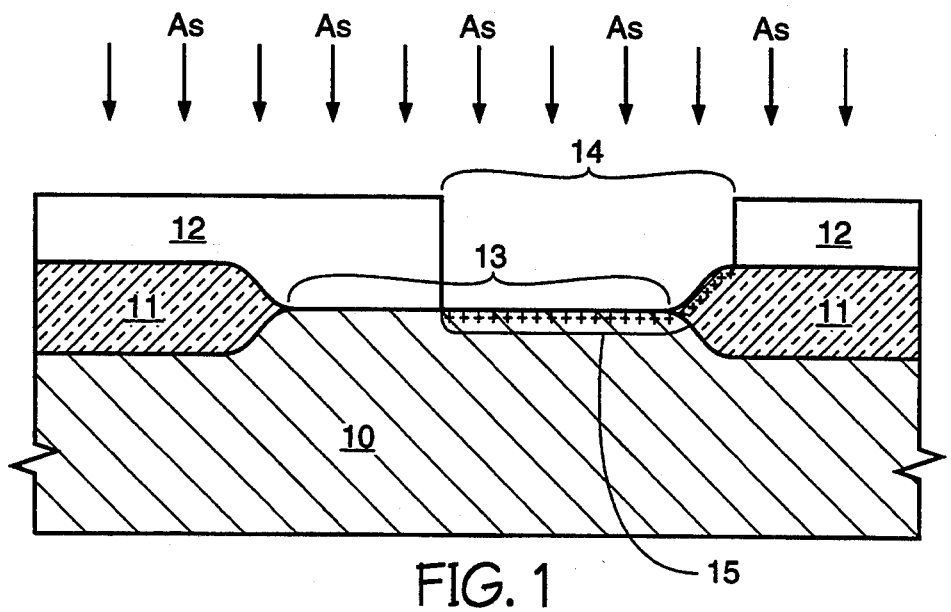
FIG. 1 is a composite cross-sectional view of an in-process wafer portion depicting an implantation of dopants into a supporting substrate to form a first diffusion region.

Referring now to FIG. 1, a supporting substrate 10, (silicon is used in this example) is prepared such that areas 13 of the substrate are spaced apart by field silicon dioxide regions 11. A patterned masking layer 12, such as photoresist, is formed to provide a buried contact implant window 14 to expose a portion of at least one spaced apart area 13 and an adjacent field oxide end portion. Depending on the desired fabrication pattern, many spaced apart areas 13 could be exposed by masking layer 12. Note at this point, substrate 10 is not covered with a sacrificial oxide layer which is an intent of the present invention. Next, an implant is performed through implant window 14 to form a first diffusion region 15. Though arsenic is shown to provide an N-type diffusion, any desired conductive dopant may be used, such as boron to provide an P-type diffusion. This implant not only forms a first diffusion region in substrate 10, it also damages the exposed field oxide end portion by changing its etch rate.

Figure 2A:
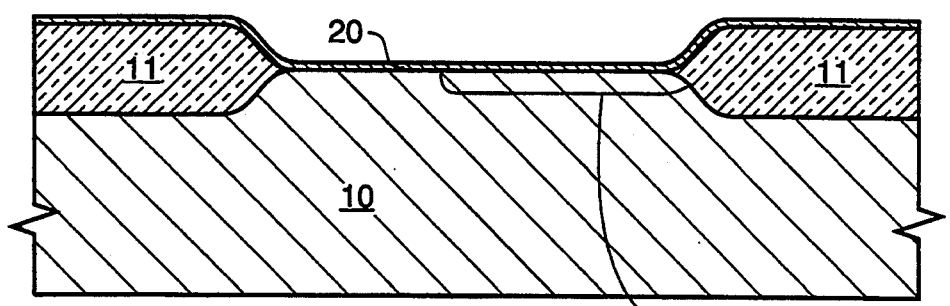
FIG. 2 is a composite cross-sectional view of the in-process wafer portion of FIG. 1 following a resist strip, formation and removal of a sacrificial oxide, formation of a gate oxide layer and forming an optional polysilicon layer.
Figure 2B:
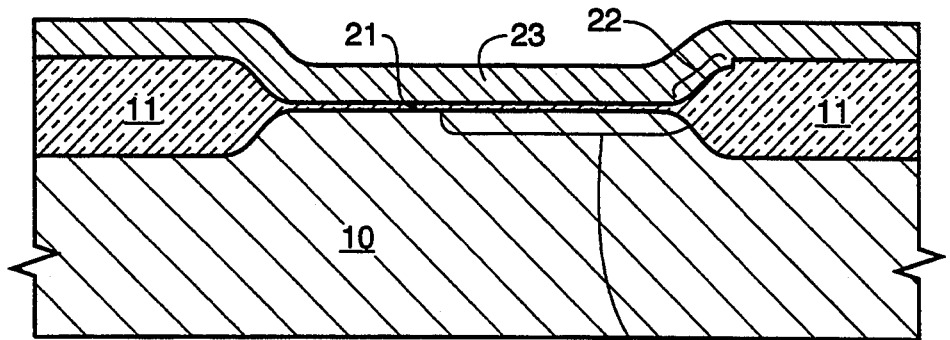

Referring now to FIG. 2, masking layer 12 has been stripped and a sacrificial silicon dioxide layer (not shown) has been formed and removed. The sacrificial silicon dioxide layer is formed at a temperature greater than 700° C. in order to anneal the exposed field oxide end portion by driving the dopant impurities out of the field oxide end portion and thus returning the field oxide's etch rate to its original level. The sacrificial oxide is then removed and only a slight thinning of field oxide 11 have occurred along notch portion 22. Once the sacrificial oxide is removed a gate silicon dioxide layer 21 is formed over substrate spaced apart areas 13. Next, an optional polysilicon layer 23 is formed over gate oxide layer 21 and field oxide regions 11.

Figure 3:
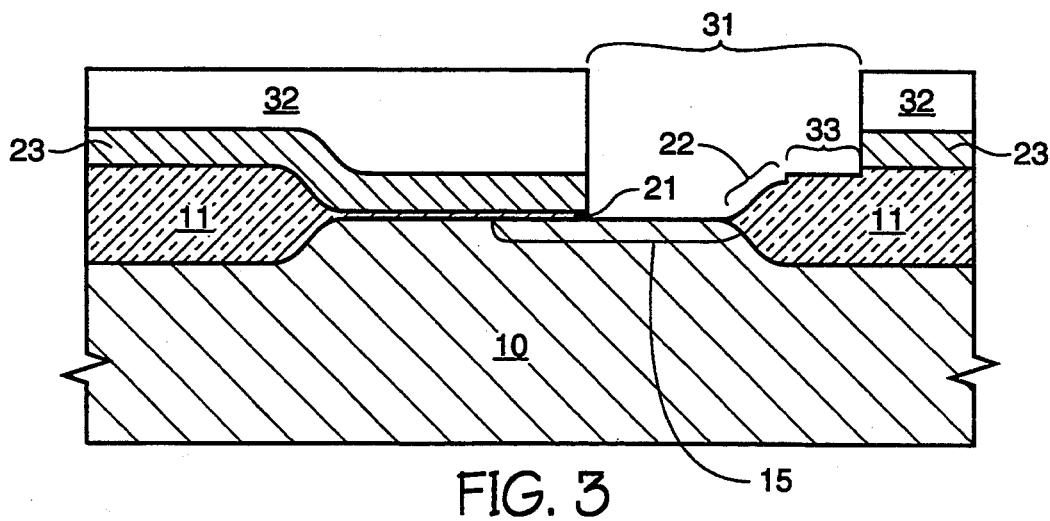
FIG. 3 is a composite cross-sectional view of the in-process wafer portion of FIG. 2 following the formation and patterning of a buried contact window to re-expose a portion of the first diffusion region.
Figure 5:
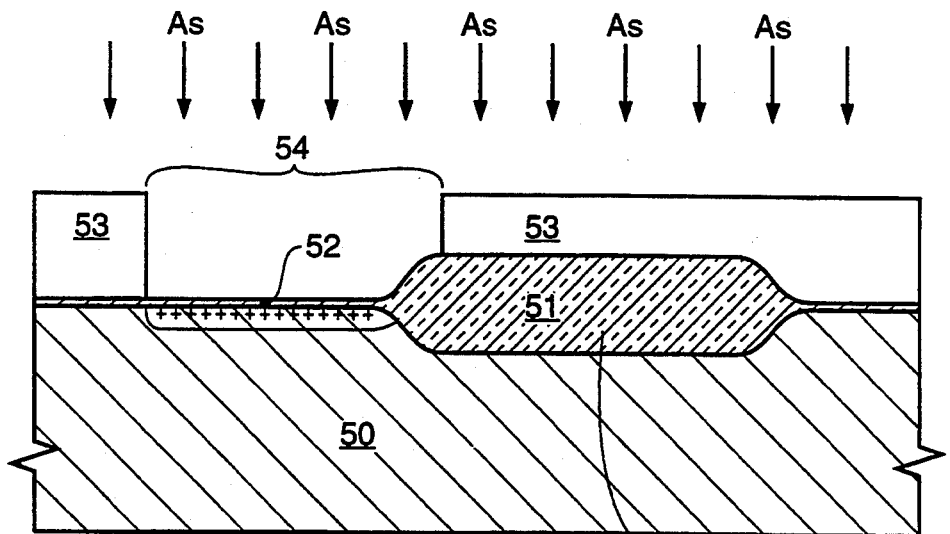
FIG. 5 is a composite cross-sectional view of an in-process wafer portion depicting an implantation of dopants into a supporting substrate through a sacrificial oxide to form a first diffusion region.
Figure 6:
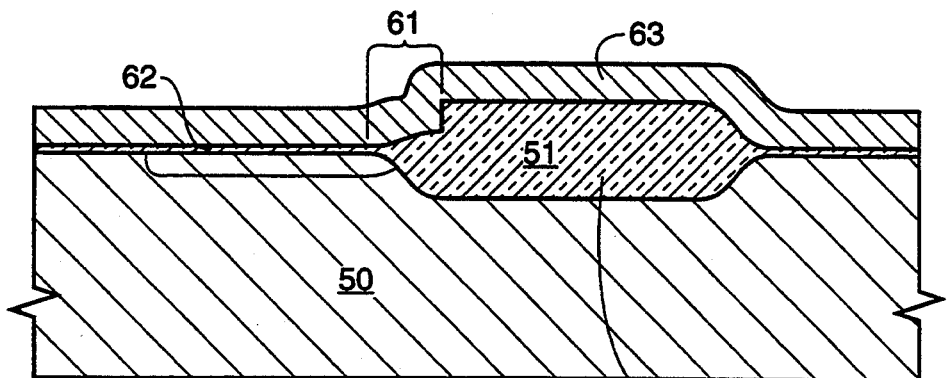
FIG. 6 is a composite cross-sectional view of the in-process wafer portion of FIG. 5 following a resist strip, removal of the sacrificial oxide, formation of a gate oxide layer and forming an optional polysilicon layer.
Figure 7:
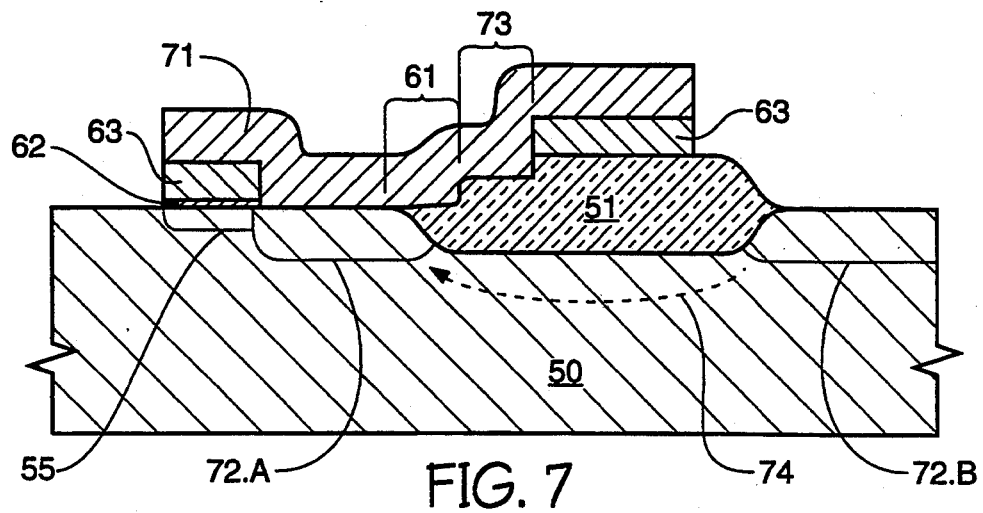
FIG. 7 is a composite cross-sectional view of the in-process wafer portion of FIG. 6 following the formation and patterning of a buried contact window, a resist strip and the formation of a patterned conductively doped polysilicon layer.

Referring now to FIG. 3, a buried contact window 31 is provided by patterning a masking layer 32, such as photoresist, to expose optional polysilicon layer 23. A subsequent etch removes the exposed portion of polysilicon layer 23 and the underlying gate oxide layer 21 to expose at least a portion of first diffusion region 15 and to re-expose the field oxide endportion. During this etch a second slight thinning of field oxide 11 have occurred along notch portion 33. The thinning of field oxide end is reduced by as much as 40% compared to conventional methods typified by FIGS. 5–7.

Figure 4:
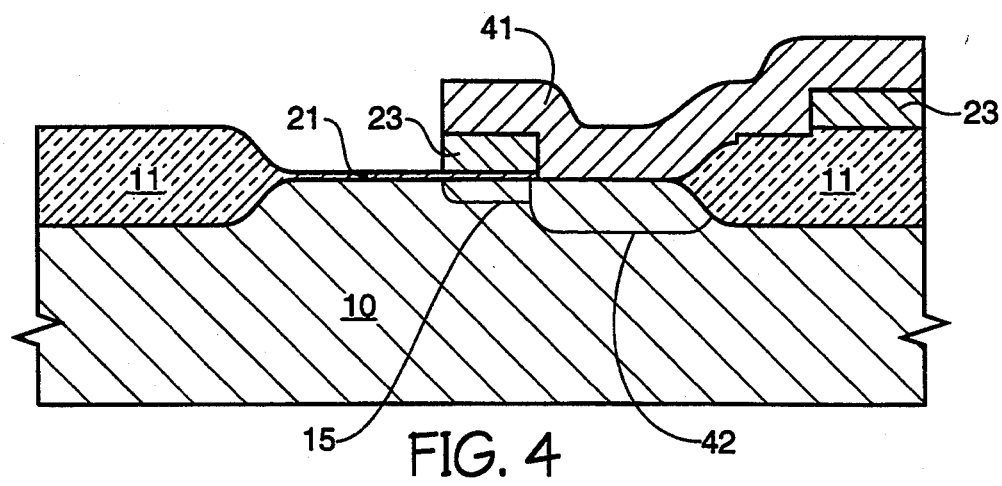
FIG. 4 is a composite cross-sectional view of the in-process wafer portion of FIG. 3 following a resist strip and the formation of a patterned conductively doped polysilicon layer.

Referring now to FIG. 4, masking layer 32 has been stripped and a conductively doped polysilicon layer 41 (either N-type or P-type, depending on what is desired) is formed and patterned to make contact to diffusion region 15. During subsequent annealing steps, the conductive dopants present in polysilicon layer 41, out-diffuse into substrate 10 to form a second diffusion region 42. The depth of diffusion region 42 into substrate 10 depends on the concentration of dopants present in polysilicon 41 and the subsequent annealing temperature used. Thus it may penetrate deeper into the substrate than does diffusion 15, though it is not required.

The present invention just described is specifically targeted towards (but not limited to) static random access memory devices (SRAMs) to provide a buried contact interconnect for cross-coupled storage latch. For example in FIG. 4, diffusion region 42, in combination with diffusion region 15, serve as the drain terminal of an N-channel pulldown device, while polysilicon 41 couples the N-channel's drain terminal to the gate of a second pulldown device.

As those skilled in the art will appreciate from the detailed description of the present invention other applications, not limited to SRAMs, may be implemented as well. Therefore, it is to be understood that although the present invention has been described with reference to a main embodiment, various modifications, known to those skilled in the art, may be made to the structure and process steps presented herein without departing from the invention as recited in the several claims appended hereto.

What is claimed is:

1. A semiconductor fabrication process for forming a buried contact on a supporting substrate having areas spaced apart by field silicon dioxide regions, said process comprising the steps of:

forming a patterned masking layer over said field silicon dioxide regions and said spaced apart areas of said supporting substrate, thereby providing a buried contact implant window to expose a portion of at least one spaced apart area and an adjacent field silicon dioxide end portion;

performing a dopant implant through said buried contact implant window, said implant forming a first diffusion region in said exposed spaced apart area and changing the etch rate of said exposed field silicon dioxide end portion;

removing said patterned masking layer;

forming a sacrificial silicon dioxide layer at a temperature greater than 700° C., over said field silicon dioxide regions and said spaced apart areas of said supporting substrate, thereby annealing said exposed field silicon dioxide end portion and returning the etch rate of said exposed field silicon dioxide end portion to substantially the same etch rate as prior to the implantation step;

removing said sacrificial silicon dioxide layer;

forming a gate silicon dioxide layer over said spaced apart areas;

providing a buried contact window which exposes said first diffusion region and re-exposes said field silicon dioxide end portion; and forming a patterned layer of doped polysilicon that makes direct contact to said first diffusion region via said buried contact window;

wherein an out-diffusion of the dopants from said patterned doped polysilicon forms a second diffusion within said first diffusion region.

2. The process of claim 1, further comprising forming a first polysilicon layer over said gate silicon dioxide layer prior to the step of providing a buried contact window.

3. The process of claim 1, wherein said masking layer comprises photoresist.

4. The process of claim 1, wherein the dopants for said dopant implant and said doped polysilicon comprise N-type dopants.

5. The process of claim 4, wherein said N-type dopants comprise arsenic atoms.

6. The process of claim 1, wherein the dopants for said dopant implant and said doped polysilicon comprise P-type dopants.

7. The process of claim 6, wherein said P-type dopants comprise boron atoms.

8. A Static Random Access Memory (SRAM) fabrication process for forming a buried contact on a supporting silicon substrate having areas spaced apart by field silicon dioxide regions, said process comprising the steps of:

forming a patterned masking layer over said field silicon dioxide regions and said spaced apart areas of said supporting silicon substrate, thereby providing a buried contact implant window to expose a portion of at least one spaced apart area and an adjacent field silicon dioxide end portion;

performing a dopant implant through said first buried contact implant window, said implant forming a first diffusion region in said exposed spaced apart area and changing the etch rate of said exposed field silicon dioxide end portion;

removing said patterned masking layer;

forming a sacrificial silicon dioxide layer at a temperature greater than 700° C., over said field silicon dioxide regions and said spaced apart areas of said supporting silicon substrate, thereby annealing said exposed field silicon dioxide end portion and returning the etch rate of said exposed field silicon dioxide end portion to substantially the same etch rate as prior to the implantation step;

removing said sacrificial silicon dioxide layer;

forming a gate silicon dioxide layer over said spaced apart areas;

providing a buried contact window which exposes said first diffusion region and re-exposes said field silicon dioxide end portion; and forming a patterned layer of doped polysilicon that makes direct contact to said first diffusion region via said buried contact window;

wherein an out-diffusion of the dopants from said patterned doped polysilicon forms a second diffusion within said first diffusion region.

9. The process of claim 8, further comprising forming a first polysilicon layer over said gate silicon dioxide layer prior to the step of providing a buried contact window.

10. The process of claim 8, wherein said masking layer comprises photoresist.

11. The process of claim 8, wherein the dopants for said dopant implant and said doped polysilicon comprise N-type dopants.

12. The process of claim 11, wherein said N-type dopants comprise arsenic atoms.

13. The process of claim 8, wherein the dopants for said dopant implant and said doped polysilicon comprise P-type dopants.

14. The process of claim 13, wherein said P-type dopants comprise boron atoms.

15. A Static Random Access Memory (SRAM) fabrication process for forming a buried contact on a supporting silicon substrate having areas spaced apart by field silicon dioxide regions, said process comprising the steps of:

patterning and etching a photoresist masking layer over said field silicon dioxide regions and said spaced apart areas of said supporting silicon substrate, thereby providing a buried contact implant window to expose a portion of at least one spaced apart area and an adjacent field silicon dioxide end portion;

implanting an N-type dopant through said buried implant contact window, said implant forming a first N-type diffusion region in said exposed spaced apart area and changing the etch rate of said exposed field silicon dioxide end portion;

stripping said photoresist masking layer;

growing a sacrificial silicon dioxide layer at a temperature greater than 700° C., over said field silicon oxide regions and said spaced apart areas of said supporting silicon substrate, thereby annealing said exposed field silicon dioxide end portion and returning the etch rate of said exposed field silicon dioxide end portion to substantially the same etch rate as prior to the implantation step;

stripping said sacrificial silicon dioxide layer;

growing a gate silicon dioxide layer over said spaced apart areas;

depositing a first polysilicon layer over said gate silicon dioxide layer;

patterning and etching a buried contact window in said first polysilicon layer, thereby exposing said first diffusion region and re-exposing said field silicon dioxide end portion;

depositing a second polysilicon layer superjacent said first polysilicon layer, said second polysilicon layer is conductively doped with N-type dopants; and patterning said first and second polysilicon layers, said first polysilicon layer forms a gate over said gate oxide and said second polysilicon layer makes direct contact to said diffusion region via said buried contact window;

wherein an out-diffusion of the dopants from said patterned doped polysilicon forms a second N-type diffusion region within said first N-type diffusion region.

16. The process of claim 15, wherein said N-type dopants comprise arsenic atoms.

* * * * *